United States Patent
Otremba

(10) Patent No.: US 7,476,978 B2
(45) Date of Patent: Jan. 13, 2009

(54) ELECTRONIC COMPONENT HAVING A SEMICONDUCTOR POWER DEVICE

(75) Inventor: Ralf Otremba, Kautbeuren (DE)

(73) Assignee: Infineon Technologies, AG, Munich (DE)

(*) Notice: Subject to any disclaimer, the term of this patent is extended or adjusted under 35 U.S.C. 154(b) by 419 days.

(21) Appl. No.: 11/383,915

(22) Filed: May 17, 2006

(65) Prior Publication Data

US 2007/0267729 A1  Nov. 22, 2007

(51) Int. Cl.
*H01L 29/40* (2006.01)
*H01L 21/44* (2006.01)

(52) U.S. Cl. ............................ 257/779; 438/612

(58) Field of Classification Search ............... 438/229, 438/283, 299, 612; 257/690, 779
See application file for complete search history.

(56) References Cited

U.S. PATENT DOCUMENTS

| | | | | |
|---|---|---|---|---|
| 6,133,634 A | 10/2000 | Joshi | ............... | 257/738 |
| 6,582,990 B2 | 6/2003 | Standing | ............... | 438/106 |
| 6,624,522 B2 | 9/2003 | Standing et al. | ............... | 257/782 |
| 6,677,669 B2 | 1/2004 | Standing | ............... | 257/685 |
| 6,683,375 B2 | 1/2004 | Joshi et al. | ............... | 257/690 |
| 6,717,260 B2 | 4/2004 | Pavier et al. | ............... | 257/728 |
| 6,767,882 B1 | 7/2004 | Jagannath et al. | ............... | 510/441 |
| 6,777,800 B2 | 8/2004 | Madrid et al. | ............... | 257/690 |
| D503,691 S | 4/2005 | Standing et al. | ............... | D13/182 |
| 6,890,845 B2 | 5/2005 | Standing et al. | ............... | 438/614 |
| 2003/0173684 A1 | 9/2003 | Joshi et al. | ............... | 257/783 |
| 2004/0137724 A1 | 7/2004 | Joshi et al. | ............... | 438/672 |
| 2005/0121784 A1 | 6/2005 | Standing | ............... | 257/737 |
| 2006/0017174 A1* | 1/2006 | Otremba | ............... | 257/778 |

FOREIGN PATENT DOCUMENTS

DE    10 2004 030 042 A1    1/2006

OTHER PUBLICATIONS

Andrew Sawle et al., "DirectFET—A Proprietary New Source Mounted Power Package for Board Mounted Power", International Rectifier (www.irf.com), pp. 1-5, Mar. 11, 2005.
Application Note AN-1035, "DirectFET Technology Board Mounting Application Note", International Rectifier (www.irf.com), 11 pages, Jan. 9, 2006.
FDZ291P "P-Channel 1.5 V. Specified PowerTrench BGA MOSFET", Fairchild Semiconductor, 3 pages, Feb. 2006.
FDZ208P "P-Channel 30 Volt PowerTrench BGA MOSFET", Fairchild Semiconductor, 3 pages, Feb. 2006.
FDZ209N "60V N-Channel PowerTrench BGA MOSFET" Fairchild Semiconductor, 3 pages, May 2004.
FDZ2553N "Monolithic Common Drain N-Channel 2.5V Specified PowerTrench BGA MOSFET", Fairchild Semiconductor, 3 pages, Feb. 2003.
Package Information, Vishay Siliconix, PolarPAK (Option L), Document No. 72945, www.vishay.com, Jun. 10, 2005.

* cited by examiner

*Primary Examiner*—Calvin Lee
(74) *Attorney, Agent, or Firm*—Banner & Witcoff, Ltd.

(57) ABSTRACT

An electronic component adapted to be mounted on a substrate with landing pads having a landing pad layout has a power semiconductor device and outer contact surfaces with a component pad layout. The outer contact surfaces have an arrangement so that, in a first orientation, the component pad layout matches the landing pad layout and in a rotational reorientation of the entire electronic component about the component axis by an angle other than 360°, the outer contact surfaces are translated to each other so that the component pad layout matches the landing pad layout.

25 Claims, 11 Drawing Sheets

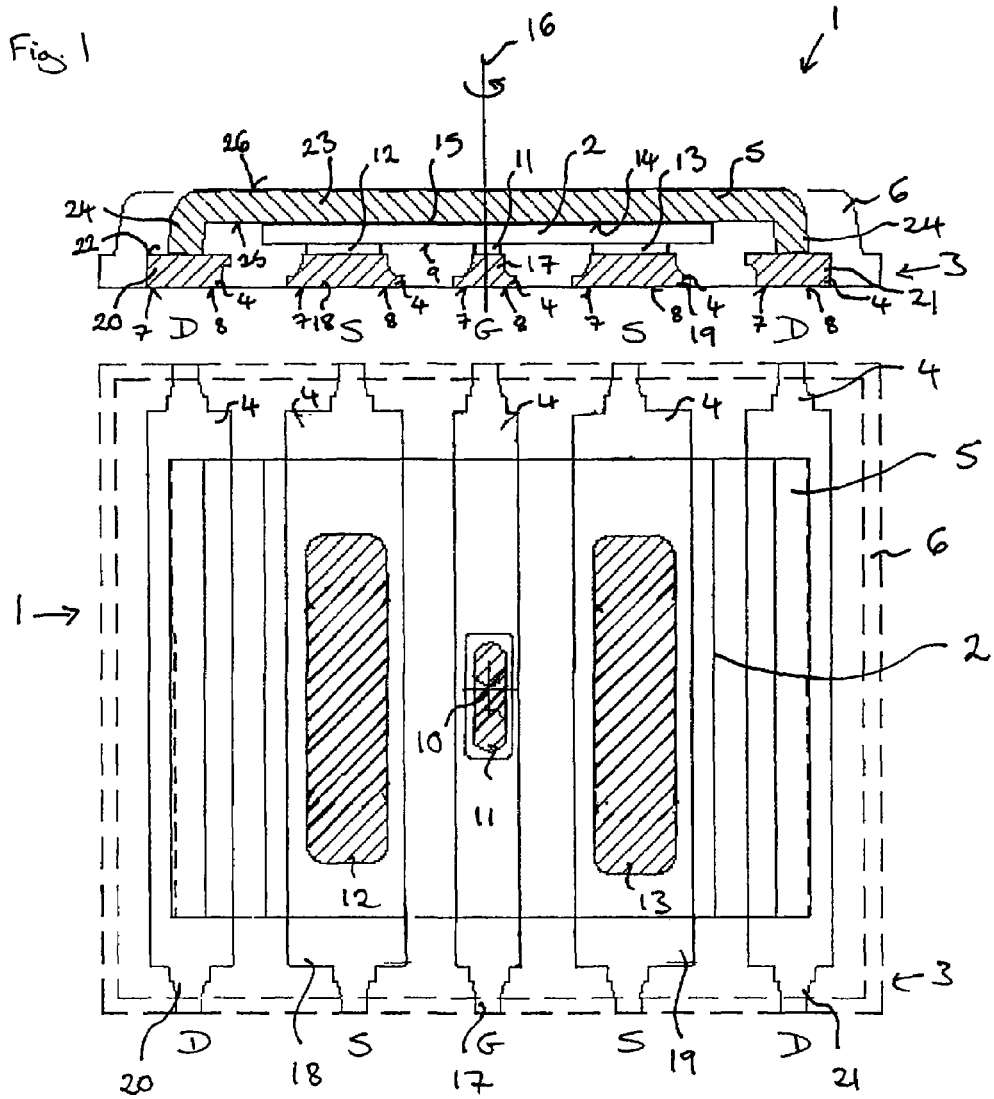

ELECTRONIC COMPONENT HAVING A SEMICONDUCTOR POWER DEVICE

TECHNICAL FIELD

The application relates to an electronic component, and in particular to an electronic component comprising a semiconductor power device.

BACKGROUND

Generally, increasingly smaller electronic devices with an increasingly higher performance are desired. At the same time, it is desired to improve the reliability and to reduce the cost of the both electronic components themselves as well as the article in which they are used, such as a computer.

Due to this increasing demand for higher power semiconductor components, inefficient heat dissipation from the semiconductor chip, as well as from the package in which it is accommodated, is an increasing problem. Poor heat dissipation can lead to instability of the semiconductor device and limit its functionality. Furthermore, heat dissipation from power devices into the printed circuit board on which they are mounted is, in some circumstances, also undesirable as this can lead to overheating of neighbouring devices mounted on the printed circuit board.

This leads to an increased complexity in board design and the use of additional external heat dissipaters which increases the costs.

Further improvements to the thermal performance of electronic components including power semiconductor devices, as well as reductions in the cost of the component are desirable.

SUMMARY

An electronic component adapted to be mounted on a substrate which may comprise landing pads having a landing pad layout comprises a semiconductor power device comprising at least one first load electrode, at least one control electrode and at least one second load electrode, a plurality of outer contact surfaces having a geometric centre and being positioned in a contact plane, wherein each outer contact surface can be assigned one of three different designations and wherein the plurality of outer contact surfaces may define a component pad layout, an electrically conductive rewiring structure, the rewiring structure electrically connecting the first load electrode, the control electrode and the second load electrode to the outer contact surfaces, and a component axis positioned generally perpendicular to the contact plane and in the geometric centre of said plurality of outer contact surfaces. The plurality of outer contact surfaces may have an arrangement so that, in a first orientation, the component pad layout matches the landing pad layout and in a rotational reorientation of the entire electronic component about the component axis by an angle other than 360°, the outer contact surfaces are translated to each other so that the component pad layout matches the landing pad layout.

An electronic component may comprise a semiconductor power device comprising at least one first load electrode, at least one control electrode and at least one second load electrode, surface mountable outer contact surfaces and an electrically conductive rewiring structure. The outer contact surfaces can be positioned in a contact plane having a component axis of rotation positioned generally perpendicular to the contact plane. The rewiring structure may electrically connect the first load electrode, the control electrode and the second load electrode of the semiconductor power device to the outer contact surfaces. The outer contact surfaces may have an arrangement defining a component pad layout so that the electronic component is mountable on landing pads of a substrate, the landing pads having a defined landing pad layout, in a first orientation about said component axis providing a component performance during operation and so that the electronic component is mountable in a selected rotational reorientation about said component axis on said landing pads having said defined landing pad layout without an alteration in said component performance during operation due to said rotational reorientation. The selected rotational orientation about the component axis can be an angle other than 360°.

BRIEF DESCRIPTION OF THE DRAWINGS

FIG. 1 illustrates a cross-sectional view of an electronic component according to a first embodiment which comprises a first component pad layout, FIG. 2 illustrates a plan view of the electronic component of FIG. 1.

DETAILED DESCRIPTION

Figure 3:
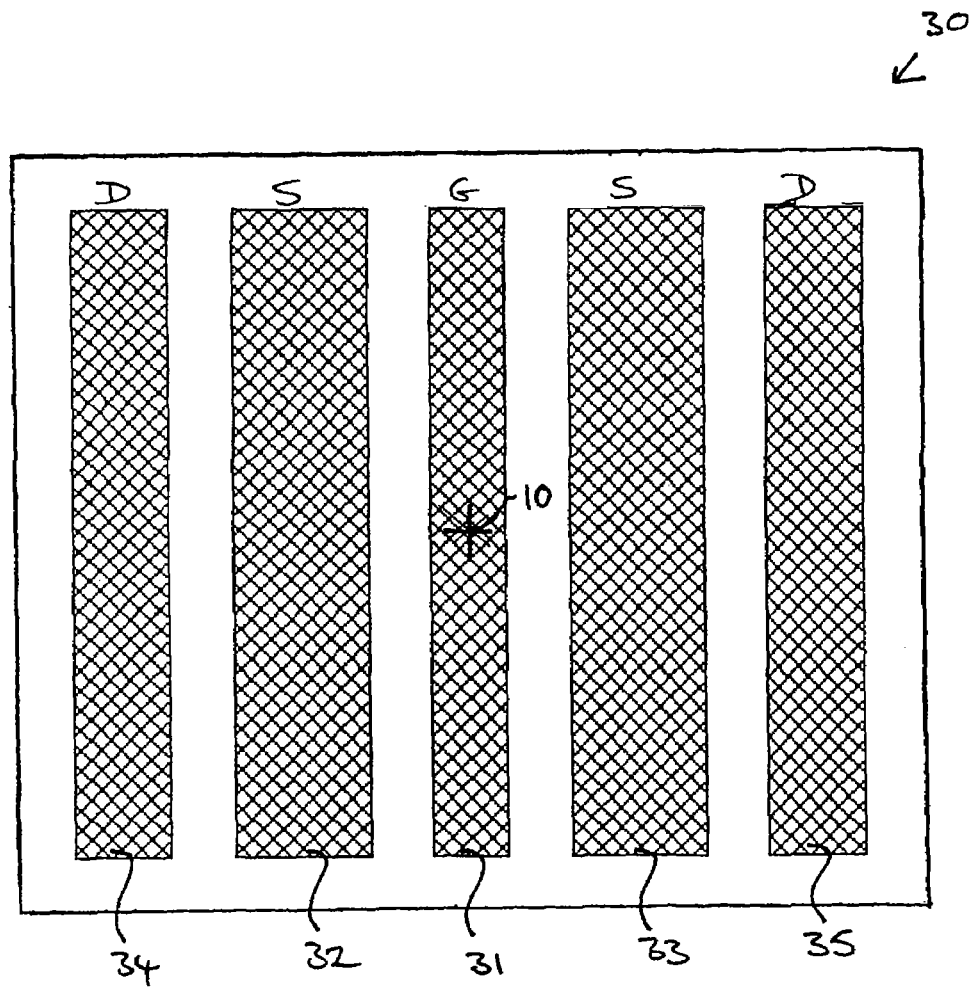
FIG. 3 illustrates a plan view of a substrate having a landing pad arrangement for the component of FIGS. 1 and 2.

An electronic component is adapted to be mounted on a substrate which comprises landing pads having a landing pad layout. The electronic component comprises a semiconductor power device comprising at least one first load electrode, at least one control electrode and at least one second load electrode. The electronic component further comprises a plurality of outer contact surfaces having a geometric centre and being positioned in a contact plane. Each outer contact surface is assigned one of three different designations. The plurality of outer contact surfaces define a component pad layout. The electronic component further comprises an electrically conductive rewiring structure, the rewiring structure electrically connecting the first load electrode, the control electrode and the second load electrode of the semiconductor power device to the outer contact surfaces and a component axis generally perpendicular to the contact plane and in the geometric centre of said plurality of outer contact surfaces. The plurality of outer contact surfaces have an arrangement so that, in a first orientation about said component axis, the component pad layout matches the landing pad layout of the substrate and in a rotational reorientation of the entire electronic component about the component axis by an angle other than 360°, the outer contact surfaces are translated to each other so that the component pad layout matches the landing pad layout.

An electronic component comprising a semiconductor power device is, therefore, provided which is adapted to be mounted on a substrate having a defined landing pad layout in at least two different rotational orientations without the performance of the electronic components during operation being altered due to the rotational orientation in which the electronic component is mounted on the landing pad layout. A rotational reorientation of 360° is excluded. 360° also includes multiples of 360°, for example 720° and 1080°.

As used herein, the performance of the electronic component is defined by the parameters given in the datasheet supplied with the electronic component. A power transistor has a performance defined by the following parameters among others: maximum continuous drain current, $I_D$; maximum gate source voltage $V_{GS}$; maximum thermal Resistance, junction—case, $R_{thJC}$; maximum Drain-source on-state resistance $R_{DS(on)}$ measured at a selected $V_{GS}$ and $I_D$; minimum Drain-Source breakdown voltage, $V_{(BR)DSS}$ at a preselected $V_{GS}$ and $I_D$; and maximum and minimum gate threshold voltage, $V_{GS(th)}$ measured at a preselected $V_{GS}$, $I_D$ and temperature.

The mounting of the electronic component on a substrate is, therefore, more flexible and board design is simplified. A deterioration in the performance of the electronic component during operation due to the reorientation is, therefore, avoided.

The outer contact surfaces are each assigned one of three different designations. Each designation corresponds to one of three different types of electrode of the semiconductor power device. For example, an outer contact surface assigned as source is electrically connected to the source electrode, an outer contact surface assigned a designation of gate is electrically connected to a gate electrode and an outer contact surface assigned a designation of drain is electrically connected to a drain electrode. Each outer contact surface, therefore, has one of three different functions.

The outer contact surfaces are arranged to provide a component pad layout so that the electronic component may be mounted on a substrate in two or more orientations about the component axis of the electronic component. The arrangement of the outer contact surfaces ensures that the performance of the electronic component in operation is the same in each of the orientations. The outer contact surfaces are arranged so that they translated to each other and so that a deterioration in performance is prevented if the electronic component is mounted on the landing pads in the selected rotational reorientation rather than the first orientation.

In an embodiment, a rotational reorientation of the entire electronic component about the component axis by an angle of 90° or 270° from a first orientation, in which the component pad layout matches the landing pad layout of the substrate, translates the outer contact surfaces to each other so that the component pad layout matches the landing pad layout. In this context, an angle of 90° or 270° includes multiples of these angles which do not result in an angle of 360° or a multiple of 360°.

In an embodiment, a rotational reorientation of the entire electronic component about the component axis by an angle of 180° from this first orientation results in an unaltered performance as the outer contact surfaces are translated to each other so that the component pad layout matches the landing pad layout. In this context, 180° includes multiples of 180° which do not result in an angle of 360° or a multiple of 360°.

In an embodiment, each of the three designations translates only within itself. An outer contact surface with a first designation, therefore, translates to an outer contact surface with a first designation. Similarly, an outer contact surface with the second designation translates only to a second designation and an outer contact surface with a third designation translates only to an outer contact surface with a third designation.

In an embodiment, the semiconductor power device is a vertical semiconductor power device. In a further embodiment, the semiconductor power device is a lateral semiconductor power device.

The semiconductor power device may be a MOSFET device (Metal Oxide Semiconductor Field Effect Transistor) and an IGBT device (Isolated Gate Bipolar Transistor). In the case of a MOSFET device, the three different designations of the outer contact surfaces are referred to as source, drain, and gate. The first load electrode is a source and the second load electrode is a drain. In the case of an IGBT device, the three different designations of the outer contact surfaces are referred to as emitter collector and gate. The semiconductor power device may be one of a BJT (Bipolar Junction Transistor) and an IGBT and the first load electrode is a collector and the second load electrode is an emitter. The three different designation are referred to as emitter, collector and gate.

In an embodiment, the electronic component is a surface mountable component. In an embodiment of a surface mountable electronic component, the electronic component further comprises a leadframe having a lower surface. The lower surface of the leadframe provides the outer contact surfaces which have a component pad layout according to one of the embodiments previously described.

In an embodiment of the surface mountable electronic component, the plurality of outer contact surfaces are provided by a plurality of bump contacts. The bump contacts may be solder balls and are provided with an arrangement providing a component pad layout according to one of the embodiments previously described.

In an embodiment of a surface mountable electronic component, the electronic component further comprises a contact clip having at least one peripheral rim portion. The outer contact surfaces of the electronic component are provided by outer surfaces of a first structured metallization positioned on a first surface of the semiconductor power device and by lower surfaces of the peripheral rim portion of the contact clip. The outer surfaces of the first structured metallization and lower surfaces of the peripheral rim portion of the contact clip are, therefore, coplanar and together have an arrangement such that a component pad layout is provided according to one of the embodiments previously described.

In an embodiment of a surface mountable electronic components, the semiconductor power device comprises at least one electrically conductive via. The semiconductor power device may be a vertical semiconductor power device and outer contact surfaces of all three different designations may be provided on a first surface of the semiconductor power device. The through hole or via provides a rewiring structure from an electrode positioned on a second surface to an outer contact surface positioned on the first surface which opposes the second surface. The outer contact surfaces may be provided by a plurality of bump contacts such as solder balls.

In an embodiment, the outer contact surfaces are provided by pins. The pins may protrude from one or more side faces of the housing. The pins may be provided in the from of a standard package leadframe and housing, for example a TO-220-5 package.

In an embodiment, the arrangement of the three different designations of the outer contact surfaces have a designation layout. The designation layout has rotational symmetry about the component axis and has one of twofold, threefold, fourfold rotational symmetry about the component axis. In this context, twofold, threefold and fourfold also include multiples thereof.

In an embodiment, an electronic component comprises a semiconductor power device comprising at least one first load electrode, at least one control electrode and at least one second load electrode, surface mountable outer contact surfaces and an electrically conductive rewiring structure. The outer contact surfaces are positioned in a contact plane having a component axis of rotation positioned generally perpendicular to the contact plane. The rewiring structure electrically connects the first load electrode, the control electrode and the second load electrode of the semiconductor power device to the outer contact surfaces. The outer contact surfaces have an arrangement defining a component pad layout so that the electronic component is mountable on landing pads of a substrate, the landing pads having a defined landing pad layout, in a first orientation about said component axis providing a component performance during operation and so that the electronic component is mountable in a selected rotational reorientation about said component axis on said landing pads having said defined landing pad layout without an alteration in said component performance during operation due to said rotational reorientation. The selected rotational orientation about the component axis is an angle other than 360°. In this context, 360° includes multiples of 360°.

An electronic component comprising a semiconductor power device is, therefore, provided which is mountable in a first orientation and in a selected rotational reorientation on a substrate having a defined landing pad layout without an alteration in the performance of the electronic component during operation due to the rotational reorientation.

The electronic component is, therefore, simpler for the user or customer to mount on a printed circuit board since deterioration in the performance of the component as a result of mounting the component in a rotational orientation other than the first orientation is prevented.

The electronic component, according to an embodiment, comprises only one semiconductor power device.

In an embodiment, a rotational reorientation of the entire electronic component about the component axis by an angle of 90° or 270° results in an unaltered performance. In this context, an angle of 90° or 270° includes multiples of these angles which do not result in an angle of 360° or a multiple of 360°.

In an embodiment, a rotational reorientation of the entire electronic component about the component axis by an angle of only approximately 90° or only approximately 270° results in an unaltered performance. Rotational reorientations of the entire electronic component by an angle other than approximately 90° or approximately 270° result in a deterioration in performance of the electronic component during operation.

In an embodiment, a rotational reorientation of the entire electronic component about the component axis by an angle of 180° results in an unaltered performance. In this context, 180° includes multiples of 180° which do not result in an angle of 360° or a multiple of 360°.

In an embodiment, a rotational reorientation of the entire electronic component about the component axis only by an angle of approximately 180° results in an unaltered performance. A rotational reorientation by an angle other than approximately 180° results in a deterioration in performance of the electronic component during operation.

In an embodiment, a rotational reorientation of the entire electronic component about the component axis translates the outer contact surfaces to each other such that the component pad layout is unaltered.

In an embodiment, each of the outer contact surfaces has one of three different designations. The designations of the outer contact surfaces have a designation layout. A rotational reorientation of the entire electronic component about the component axis of 90° or 270° translates the designations to each other and results in an unaltered designation layout. In this context, an angle of 90° or 270° includes multiples of these angles which do not result in an angle of 360° or a multiple of 360°.

In an embodiment, each of the outer contact surfaces has one of three different designations. The designations of the outer contact surfaces have a designation layout. A rotational reorientation of the entire electronic component about the component axis of 180° translates the designations to each other such that the designation layout is unaltered. In this context, 180° includes multiples of 180° which do not result in an angle of 360° or a multiple of 360°.

In an embodiment, each of the outer contact surfaces has one of three different designations. The designations of the outer contact surfaces have a designation layout. The designation layout has one of twofold, threefold and fourfold rotational symmetry about the component axis. In this context, twofold, threefold and fourfold also include multiples thereof.

In an embodiment, the semiconductor power device is one of a vertical power MOSFET and a vertical IGBT device. In a further embodiment the electronic component comprises only one vertical MOSFET device or only one vertical IGBT device.

In an embodiment, an electronic component is provided which is adapted to be mounted on a substrate having a substrate surface. The substrate comprises landing pads having a landing pad layout. The electronic component comprises a housing having a geometric centre, a semiconductor power device comprising at least one first load electrode, at least one control electrode and at least one second load electrode, and a plurality of outer contacts positioned in a contact plane. Each outer contact is assigned one of three different designations. The plurality of outer contacts define a component pad layout. The electronic component further comprises an electrically conductive rewiring structure, the rewiring structure electrically connecting the first load electrode, the control electrode and the second load electrode to the outer contacts, and a mounting axis positioned in the geometric centre of the housing.

The plurality of outer contacts have an arrangement so that, in a first orientation about the mounting axis, the mounting axis being positioned generally perpendicular to the substrate surface, the component pad layout matches the landing pad layout and in a rotational reorientation of the entire electronic component about the component axis by an angle other than 360°, the mounting axis being positioned generally perpendicular to the substrate surface, the outer contacts are translated to each other so that the component pad layout matches the landing pad layout.

In order to mount the electronic component on the substrate, the electronic component is orientated with respect to the substrate so that the mounting axis of the electronic component is positioned approximately perpendicularly to the substrate surface on which the landing pads are positioned.

The electronic component is then orientated about the mounting axis, the mounting axis remaining perpendicular to the substrate surface, so that the component pad layout matches with the landing pad layout such that the electronic component has a performance under operation. The electronic component may then be mounted on the landing pad layout by appropriate electrical connections. For solder ball contacts, for example, the solder balls are brought into surface to surface contact with the landing pads and a solder reflow process is carried out.

In an embodiment, the mounting axis is positioned generally parallel to said contact plane. The outer contacts may be provided by a plurality of pins which may extend from a side face of the housing of the component. The pins are, therefore orientated perpendicular to the substrate surface. The electronic component may have a housing which is a TO220-5 package.

In an embodiment, the mounting axis is positioned generally perpendicular to said contact plane. The outer contacts may be provided by a plurality of surface mountable contacts which are positioned in a contact plane. The outer contacts are, therefore, positioned in a plane parallel to the substrate surface. The surface mountable contacts may be contact bumps, solder balls, the lower surface of a leadframe a structured metallization for example.

In a first selected orientation of the component about the mounting axis, the component pad layout matches the landing pad layout. In an embodiment, a rotational reorientation of the entire electronic component about the mounting axis by an angle of 90° or 270° from this first orientation translates the outer contact surfaces to each other so that the component pad layout matches the landing pad layout when the component has this rotational reorientation.

In an embodiment, a rotational reorientation of the entire electronic component about the mounting axis by an angle of only approximately 90° or only approximately 270° results in an unaltered performance due to the rotational reorientation.

In a first selected orientation of the component about the mounting axis, the component pad layout matches the landing pad layout. In an embodiment, a rotational reorientation of the entire electronic component about the mounting axis by an angle of 180° from this first orientation translates the outer contact surfaces to each other so that the component pad layout matches the landing pad layout when the component has this rotational reorientation.

In an embodiment, a rotational reorientation of the entire electronic component about the mounting axis only by an angle of approximately 180° results in an unaltered performance.

In an embodiment, each of the three designations translates only within itself.

In an embodiment, the semiconductor power device is one of a vertical semiconductor power device and a lateral semiconductor power device. The semiconductor power device may be a MOSFET or an IGBT device.

FIG. 1 illustrates a cross-sectional view and FIG. 2 a plan view of an electronic component 1 according to a first embodiment. The electronic component 1 comprises a vertical MOSFET device 2, a leadframe 3 comprising five physically separate portions 4, a contact clip 5 and a plastic encapsulation providing a housing 6. The lower surfaces 7 of the five portions 4 of the leadframe 3 are essentially coplanar and provide surface mountable outer contact surfaces 8 of the electronic component 1.

The vertical MOSFET device 2 comprises a first surface 9 which is generally rectangular and has a geometric centre indicated by a cross 10 in FIG. 2 A gate electrode 11 and two source electrodes 12 and 13, each having generally the same shape, are positioned on the first surface 9. The gate electrode 11 is positioned in the geometric centre of the first surface 9. The source electrodes 12, 13 are positioned one on either side and equidistant from the gate contact 11. The arrangement of the gate electrode 11, and source electrodes 12, 13 is two-fold rotationally symmetric about an axis positioned perpendicular to the geometric centre 10 indicated by the cross 10. The opposing second side 14 of the MOSFET device 2 comprises a drain electrode 15 which extends over the majority of the second side 14.

The leadframe 3 comprises five physically separate portions 4, each of which has a general strip form and each of which has essentially the same length. The five portions 4 are arranged with their long sides generally parallel to one another so that the short sides of the rectangular strips are essentially coplanar. The leadframe 3 has an geometric centre also marked by the cross 10 in FIG. 2. The five portions 4 are spaced from one another such that the leadframe 3 has a twofold axis of rotational symmetry about an axis positioned perpendicular to the geometric centre 10. This axis is the component axis 16. The axis of rotational symmetry is also perpendicular to the outer contact surfaces 8 provided by the lower surface of the leadframe 3 and positioned in the geometric centre of the outer contact surfaces 8. The outer contact surfaces 8 provided by the leadframe 3, therefore, provide a component pad layout with a twofold axis of rotational symmetry about the component axis 16.

Each of the five portions 4 of the leadframe 3 are assigned one of three different designations. The centre portion 17 is designated as the gate, denoted by G, the two portions 18, 19 adjacent the gate portion 17 are designated as source, denoted by S, and the two outermost portions 20, 21 of the leadframe 3 are designated drain, denoted by D. These designations define a designation layout.

If the leadframe 3 is rotated by 180° about the component axis 10, the designation layout remains unaltered. In the view of the component shown in FIGS. 1 and 2, the order of the designations (from left to right) remains unchanged at drain source gate source drain for the orientation illustrated and after a reorientation of 180° about the component axis 10.

The MOSFET device 2 is mounted with its first surface 9 facing towards the upper surface 22 of the leadframe 3. The MOSFET device 2 is orientated with respect to the leadframe 3 so that the geometric centre of the first surface 9 and the geometric centre of the leadframe 3 are aligned with a common component axis 16.

The gate electrode 11 is, therefore, mounted on the gate portion 17 of the leadframe 3. The source electrode 12 is mounted on the source portion 18 and the source electrode 13 is mounted on the source portion 19 of the leadframe 3. The gate electrode 11 and source electrodes 12, 13 are mounted on, and electrically connected to, the respective leadframe portion 17, 18, 19 by a layer of diffusion solder not illustrated in the figures.

The second surface 14 of the MOSFET device 2 faces upwards away from the leadframe 3. The drain electrode 15 positioned on the second surface 14 of the MOSFET device 2 is electrically connected to the two outermost drain portions 20, 21 of the leadframe 3 by the contact clip 5.

The contact clip 5 comprises a flat web portion 23 which extends on two opposing sides into peripheral rim portions 24. The peripheral rim portions 24 each extend from the flat web portion 23 towards the leadframe 3. The lower surface 25 of the flat web portion 23 is mounted on the drain electrode 15 and the lower surface of each of the peripheral rim portions 24 is mounted on the upper surface 22 of a drain portion 20, 21 of the leadframe 3. The contact clip 5 is mounted on, and electrically connected to, the drain electrode 15 and the two drain portions 20, 21 of the leadframe 3 by a layer of soft solder which is not shown in the figures.

The plastic encapsulation compound 6 encapsulates the MOSFET device 2, upper regions of the leadframe 3, and side faces of the peripheral rim portions 24 of the contact clip 5. The upper surface 26 of the flat web portion 23 and the lower surfaces 7 of the leadframe 3 remain free from the plastic encapsulation 6.

If the electronic component 1 is rotated by 180° about the component axis 16, the designation layout of the outer contact surfaces 8 remains unaltered. In the view of the component 1 shown in FIGS. 1 and 2, the order of the designations remains unchanged at drain source gate source drain for the orientation illustrated and after a reorientation of 180° about the component axis 16.

After a reorientation by 180° of the entire electronic component about the component axis 16, the drain portion 20 is translated to the position of drain portion 21, source portion 18 is translated to the position of source portion 19 and gate portion 17 is translated to the position of itself. Each designation translates only within itself. Consequently the electronic component 1, when mounted to a substrate having a defined landing pad layout, as illustrated in FIG. 3, will have a component performance during operation which is an altered due to be reorientation of the electronic component by 180°.

The arrangement of the portions 4 of the leadframe 3 and the arrangement of the different designations with the associated different functions of the five portions 4 leadframe 3 provides an electronic component 1 in which the heat generated from the MOSFET device 2 is more uniformly distributed across the electronic component. Consequently, hotspots within the electronic component 1 are avoided and heat can be more uniformly and efficiently dissipated from the electronic component 1. Consequently, the performance of the component is improved.

The mechanical stability of the electronic component 1 is also improved since the leadframe 3 has twofold rotational symmetry about the component axis. The electronic component 1 may also be reliably mounted since the outer contact surfaces have a symmetrical arrangement.

Furthermore, MOSFET devices of varying lateral dimensions can be simply accommodated within the electronic component 1 having the leadframe 3 providing the component pad layout illustrated, since any rewiring required between the MOSFET device 2 and the leadframe 3 within the component housing 6 is simplified.

If the MOSFET device is provided with a gate contact positioned in the geometric centre of the first side and the two source electrodes are positioned on each of two opposing sides of the central gate electrode, the internal rewiring to mount MOSFET devices of different sizes on the leadframe 3 is further simplified.

For example, as the gate contact 11 is positioned in the centre of the first side 9 of the MOSFET 2, no rewiring for smaller or larger devices is required. The rewiring between the source electrodes 12, 13 and the source portions 18, 19 of the leadframe 3 is also simplified since rewiring in only one direction from each of the source electrodes 12, 13 to its respective source portion 18, 19 of the leadframe 3 is required.

FIG. 3 illustrates the top view of a portion of a printed circuit board 30 in which the landing pad layout for the electronic component 1 illustrated in FIGS. 1 and 2 is shown.

The landing pad layout consists of five rectangular strips each arranged with the long sides essentially parallel to one another. Each of the strips has essentially the same length and the five strips are arranged so that the short sides are essentially coplanar. The geometric centre of the landing pad layout is illustrated by a cross 10. The landing pad 31 designated as the gate landing pad is positioned with its geometric centre in the geometric centre 10 of the landing pad layout.

Two landing pads 32, 33 are designated as source landing pads and they are arranged equidistant from, and adjacent to, the central gate landing pad 31. Two landing pads 34, 35 are designated as drain landing pads. The drain landing pads 34, 35 are positioned equidistant from the gate landing pad 31. One drain landing pad 34, 35 is positioned adjacent to each of the source landing pads 32, 33 at the periphery of the landing pad layout. The five landing pad strips are, therefore, designated drain source gate source drain in the plan view of the substrate shown in FIG. 3. The landing pad arrangement has an axis of twofold rotational symmetry about an axis perpendicular to the geometric centre 10.

In order to mount the electronic component 1 on the PCB 30, the electronic component 1 is orientated so that the mounting axis 36 of the electronic component 1 is perpendicular to the substrate surface 37 on which the landing pads 31, 32, 33, 34, 35 are positioned. The mounting axis 36 of the electronic component 1 is positioned in the geometric centre of the housing 6. In this embodiment, the position of the mounting axis 36 and the component axis 16 is identical. The outer contact surfaces 8, therefore, lie generally parallel to the substrate surface 37. The electronic component 1 may then be orientated about the mounting axis 36 and, therefore, the component axis 16 so that the electronic component 1 has a first orientation.

The electronic component 1 may mounted on the PCB 30 in a first orientation in which drain portion 20 is mounted on landing pad 34, source portion 18 is mounted on landing pad 32, gate contact portion 17 is mounted or landing pad 31, source portion 19 is mounted on landing pad 33, and drain portion 21 is mounted on landing pad 35. In this orientation, the electronic component has a component performance.

The electronic component 1 may also be mounted on the PCB 30 in a second orientation without the performance of the component altering. If the entire electronic component 1 is rotated by 180° about the component axis 16, the electronic component 1 can be mounted on the PCB 30 so that drain portion 21 is mounted on landing pad 34, source portion 19 is mounted on landing pad 32, gate portion 17 is mounted on landing pad 31, source portion 18 is mounted on landing pad 33 and drain portion 20 is mounted on landing pad 35.

After this reorientation of the electronic component 1, the designation of each of the outer contact surfaces 8 of the electronic component 1 is translated only to the position of an outer contact surface of the same designation. Therefore, after a rotational reorientation of 180° about the component axis 16, the performance of the electronic component 1, when mounted on the substrate 30 and during operation, is unaltered. Consequently, a deterioration in the performance due to the reorientation of the electronic component 1 with respect to the PCB 30 is prevented.

Figure 4:
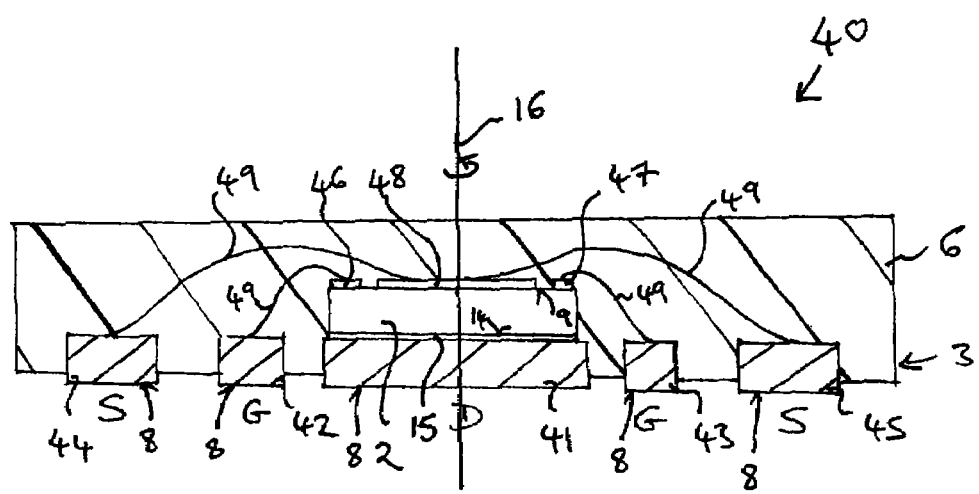
FIG. 4 illustrates a cross-sectional view of an electronic component according to a second embodiment which comprises a second component pad layout.

FIG. 4 illustrates an electronic component 40 with a component pad layout according to a second embodiment. Parts of the second electronic component 40 which are essentially the same as the first electronic component 1 are designated with the same reference number. The electronic component 40 comprises a leadframe 3 and vertical power MOSFET device 2. Similarly to the embodiment shown in FIGS. 1 and 2, the leadframe 3 consists of five portions 4, each having a strip form and arranged so that the long sides are essentially parallel to each other. Again, each portion for has essentially the same length and the five portions are arranged such that the short sides are essentially in alignment.

The electronic component 40 differs from the electronic component 1 by the designation layout of the five portions of the leadframe 3. In electronic component 40, the centre portion 41 is designated as the drain portion. The portions 42, 43 of the leadframe 3 immediately adjacent to the centre portion 41 is in each case designated as a gate portion. The two outermost strip portions of the leadframe 3 are designated as source portions 44, 45.

Consequently, when the electronic component 40 is rotated by 180° around the component axis 10, each designation of the portions of the leadframe 3 is translated to the same designation. In this embodiment, the component axis 16 and the mounting axis 36 have the same position.

In the electronic component 40, the MOSFET device 2 is mounted with its second side 15 on the upper surface 22 of the centre drain portion 41 of the leadframe 3. The first surface 9 faces upwards away from the leadframe 3 and comprises two gate electrodes 46, 47 and a source electrode 48. Gate electrode 46 is electrically connected to gate portion 42 of the leadframe 3 by a bond wire 49 and gate electrode 47 is electrically connected to gate portion 43 of the leadframe 3 by a bond wire 49. Similarly, the source electrode 48 is electrically connected to the two source portions 44, 45 of the leadframe 3 by a bond wire extending from the source electrode to each source portion 44, 45.

Figure 5:
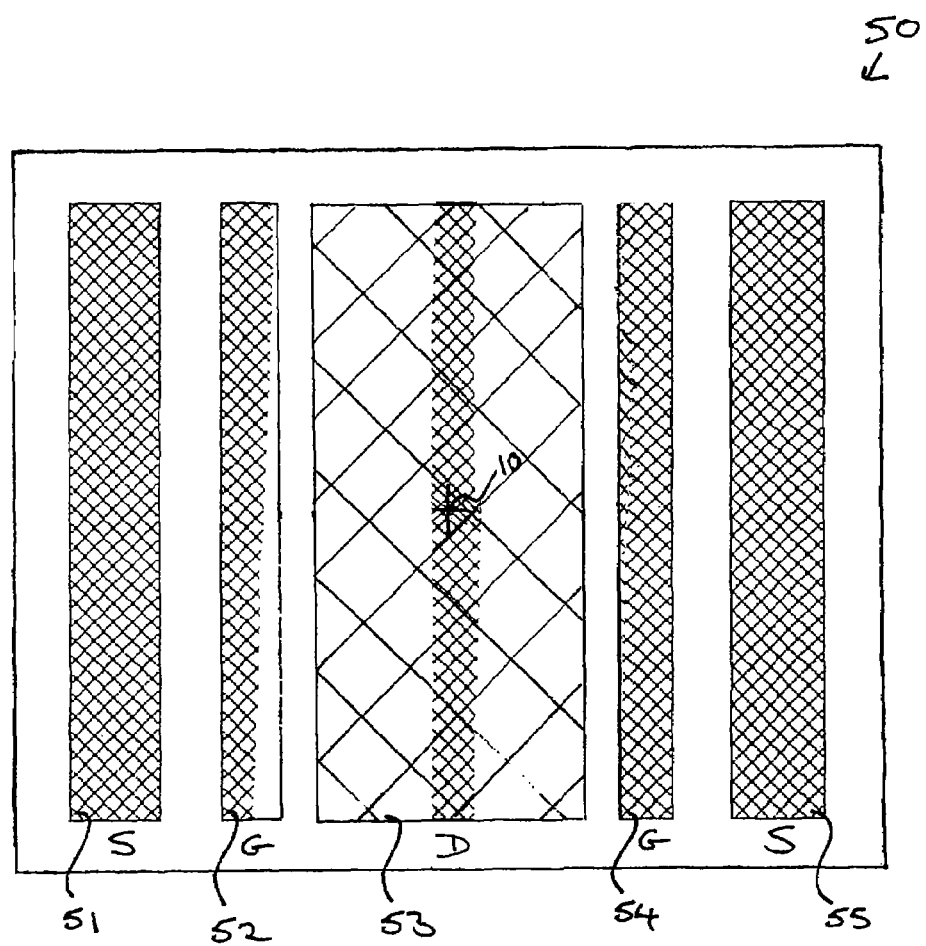
FIG. 5 illustrates a plan view of a substrate having a landing pad arrangement for the electronic component of FIG. 4.

FIG. 5 illustrates the landing pad layout on a substrate 50 for the electronic device 40. The landing pad layout also comprises rectangular landing pads in strip form of essentially the same length. The five landing pads are arranged with the long sides essentially parallel to one another and with the short sides in alignment and essentially coplanar. In the plan view of FIG. 5, the designation layout from left to right is source gate drain gate source.

The electronic device 40 may mounted the first orientation on the landing pad layout such that source outer contact 44 is mounted on source landing pad 51, gate outer contact 42 is mounted on gate landing pad 52, drain outer contact 41 is mounted on drain landing pad 53, gate outer contact 43 is mounted on a gate landing pad 54 and source outer contact 45 is mounted on source landing pad 55.

The electronic device 40 may be reorientated by 180° about the component axis 16 from this first orientation and mounted on the landing pad layout such that source outer contact 45 is mounted on source landing pad 51, gate outer contact 43 is mounted on gate landing pad 52, drain outer contact 41 is mounted on drain landing pad 53, gate outer contact 42 is mounted on a gate landing pad 54 and source outer contact 44 is mounted on source landing pad 55.

The performance of the electronic component 40 during operation is the same for the first orientation and after a reorientation of 180° about the component axis 16.

The mounting axis 36 of the electronic component 40 is positioned in the geometric centre of the housing 6 perpendicular to the contact plane. The mounting axis 36 is, therefore, positioned at the component axis position 16.

The outer contact surfaces 8 providing a component pad layout which enables a reorientation of the entire electronic components about the component axis such that the performance during operation is unaltered due to the rotational orientation may be provided in a number of forms.

Figure 6:
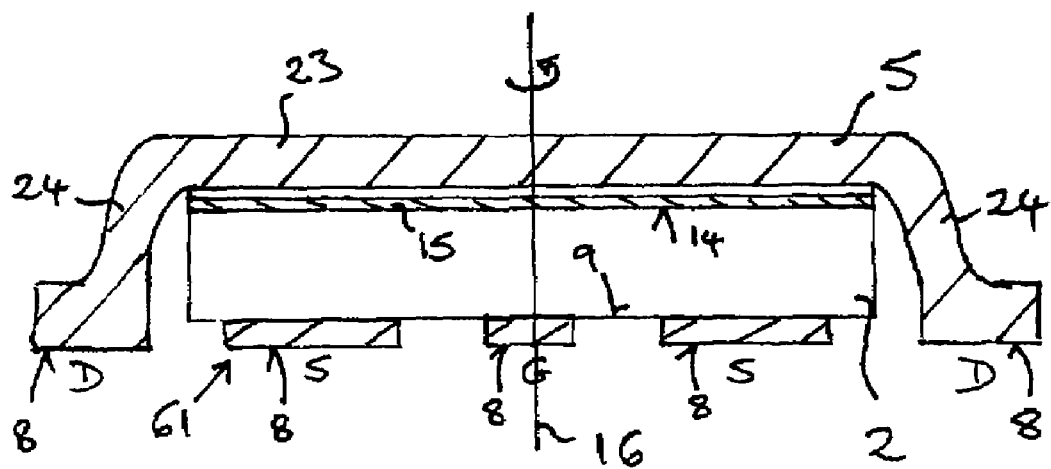
FIG. 6 illustrates a cross-sectional view of an electronic component according to a third embodiment which has the component pad layout illustrated in FIGS. 1 and 2.

FIG. 6 illustrates an cross-sectional view of a electronic component 60 comprising a vertical MOSFET device 2 and contact clip 5. The outer contact surfaces 8 have the component pad layout illustrated in FIGS. 1 and 2. The electronic component 40 is adapted to be mounted on the PCB illustrated in FIG. 3.

In this embodiment, the outer contact surfaces 8 of the electronic component 60 are provided by the outer surfaces of a structured metallization 61, which provides source electrodes 12, 13 and a gate electrode 11, positioned directly on the first surface 9 of the MOSFET device 2. The drain outer contact surfaces 8 are provided by the lower surfaces of the peripheral rim portions 24 of the contact clip 5.

Figure 7:
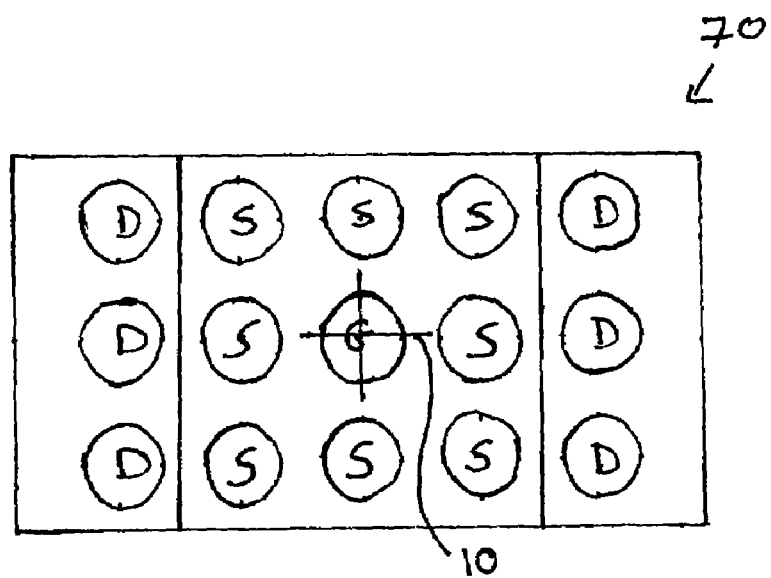
FIG. 7 illustrates a plan view of an electronic component according to a fourth embodiment comprising a third component pad layout.

FIG. 7 illustrates a plan view of the lower surface of an electronic component 70 according to a fourth embodiment which comprises a power MOSFET device. In this embodiment, the outer contact surfaces 8 are provided by solder balls in the form of a ball grid array. In the exemplary embodiment illustrated in FIG. 7, the ball grid array comprises a matrix of 15 balls arranged in a grid of 5 columns and three rows. The centre solder ball is designated as gate G. The eight solder balls positioned contiguous to the gate solder ball are designated source S and the remaining three solder balls positioned in a column at two opposing sides of the array are designated drain D.

If the electronic component 70 is rotated by 180° about an axis positioned perpendicular to the lateral centre of the gate solder ball, defined as the mounting axis 36 and the component axis 16, the position of each solder ball is translated such that it is translated to the position of a solder ball having the same designation. The drain solder balls are translated to the position of drain solder balls, source solder balls are translated to the position of source solder balls and the gate solder ball is translated to itself.

Consequently, the electronic component 70 may be mounted on a substrate with a corresponding landing pad layout in the orientation shown in FIG. 7 and in a reorientation of 180° as described without an alteration in the performance of the electronic component 70 due to the reorientation.

Figure 8:
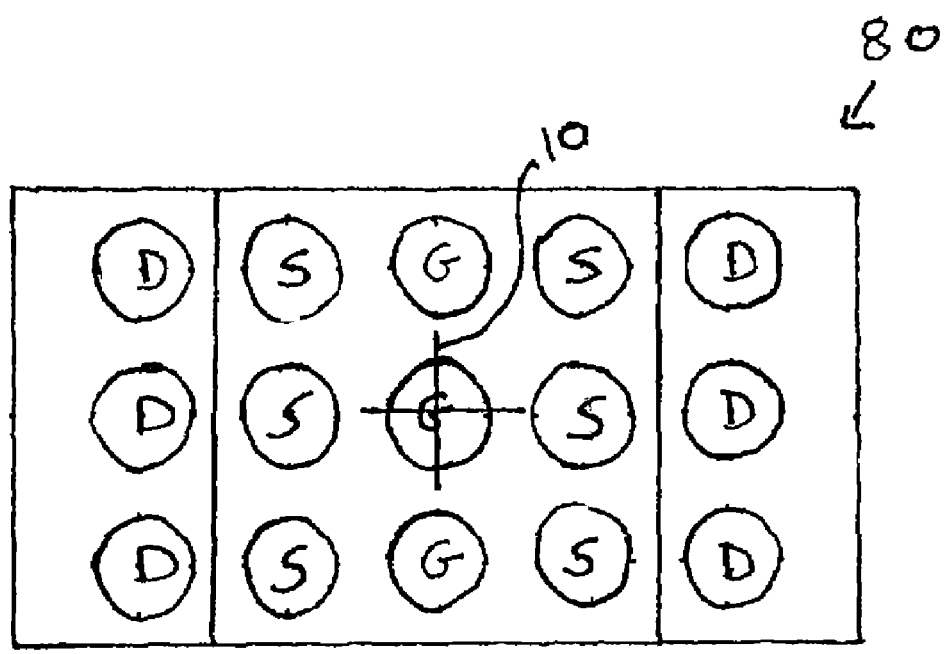
FIG. 8 illustrates a plan view of an electronic component according to a fifth embodiment comprising a fourth component pad layout.

FIG. 8 illustrates a plan view of the lower surface of an electronic component 80 according to a fifth embodiment of the invention. The electronic component 80 comprises outer contact surfaces 8 in the form of contact bumps which are arranged in an array of three rows and five columns, as in the embodiment illustrated in FIG. 7. The electronic component 80, illustrated in FIG. 8, differs from the electronic component 70 illustrated in FIG. 7 in the designation layout. In particular, each of the three contact bumps arranged in the central column are gate contacts, and each of the bumps in the column of contact bumps adjacent each side of the central column of gate contacts are source contacts. Therefore, the designation layout, from left to right in the view shown in FIG. 8, is drain source gate source drain. Therefore, the electronic component 80 may be mounted on a substrate having a landing pad layout as shown in FIG. 3.

Figure 9:
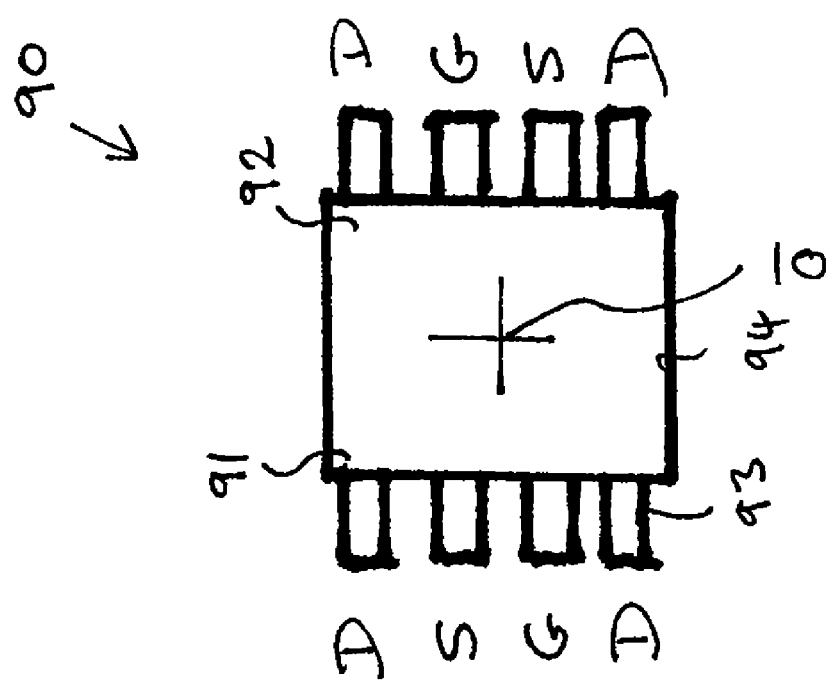
FIG. 9 illustrates a top view of an electronic component according to a sixth embodiment comprising a fifth component pad layout.

FIG. 9 illustrates a top view of an electronic component 90 according to sixth embodiment. The electronic component 90 comprises a component pad layout according to a fifth embodiment.

The electronic component 90 comprises pins 93 as outer contact surfaces 8. The electronic component 90 comprises a central chip carrying region 94 on which a single power MOSFET device, not illustrated in the top view of the electronic component 90 of FIG. 9, is mounted. The electronic component 90 comprises eight pins 93 providing eight outer contact surfaces 8. A first set of four pins 93 extend form a first side 91 and a second set of four pins 93 extend from the opposing side 92 of the central chip carrying region 94.

In the view of the electronic component 90 shown in FIG. 9, the pins 93 are arranged in two columns, each column comprising four pins 93. On the first side 91 of the electronic component 90, the pins 93 have the following designation order, form top to bottom in view shown in FIG. 9, of drain source gate drain. On the second side 92 of the electronic component 90, the pins have the following designation order, from top to bottom in the view shown in FIG. 9, of drain gate source drain.

The pins 93, therefore, have a designation layout so that when the entire electronic component 90 is rotated by at 180° about the component axis 16, each designation translates to itself and the performance of the electronic component 90 during operation is unaltered.

Figure 10:
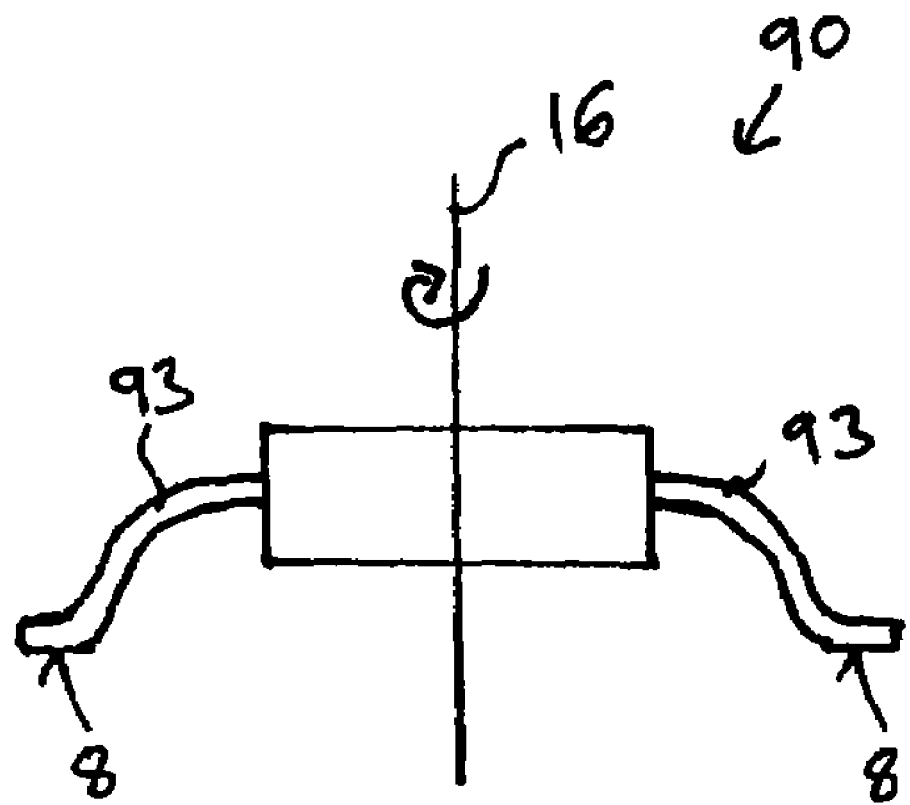
FIG. 10 illustrates a side view of the electronic component of FIG. 9.

FIG. 10 illustrates a side view of the electronic component 90 of FIG. 9. As is illustrated in FIG. 10, the pins 93 have a gull-wing shape, in which case the pins 93 protrude from the side faces of the plastic housing of the electronic component 90 and extend in a direction so that regions providing the outer contact surfaces 8 which are mountable on a substrate lie in a plane located at a distance below the lower surface of the plastic housing of the electronic component 90. However, the outer contact surfaces 8 still correspond to one all the embodiments of the outer contact surfaces previously described. The electronic component 90 may have be a Power DSO-8 package, for example.

In an embodiment not illustrated, the pins 93 may be arranged so as to protrude from the lower as well as side face of the plastic housing of the electronic component.

Figure 11:
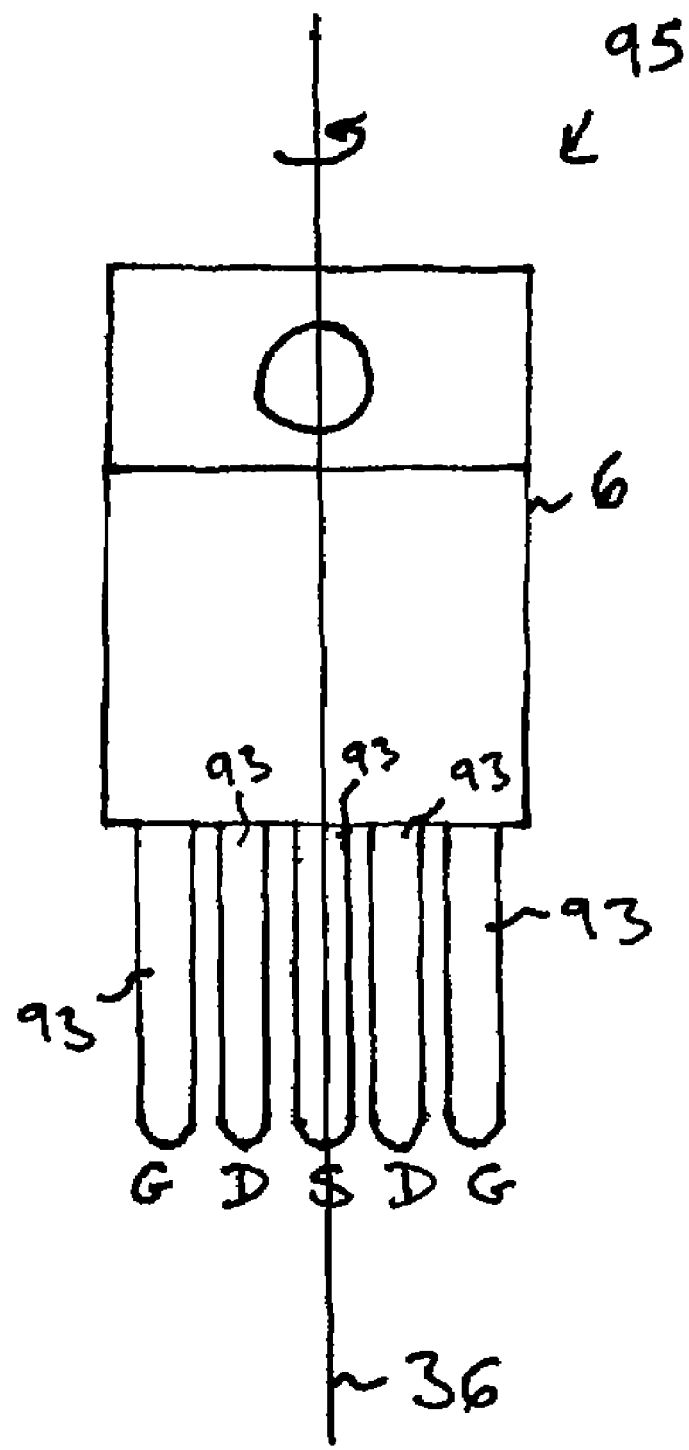
FIG. 11 illustrates a top view of an electronic component according to a seventh embodiment.

FIG. 11 illustrates a top view of an electronic component according to a seventh embodiment of the invention. Electronic component 95 comprises a To220-5 package in which five pins 93 protrude form a single side face of the housing 6.

The five pins are provided with a component pad layout which has twofold rotational symmetry about the mounting axis 36. In this embodiment, the mounting axis 36 is positioned in the geometric centre of the housing 6 and parallel to the contact plane in which the five pins 93 are positioned. This is in contrast to the embodiments shown in FIGS. 1 to 10, in which the mounting axis 36 is positioned perpendicular to the contact plane.

The pins have a designation layout which is symmetrical about the mounting axis 36 and, in the top view of the electronic component 95 illustrated in FIG. 11, are designated as gate drain source drain gate, from left to right. In a further embodiment, not illustrated in the figures, the pins have designation layout source gate drain gate source, from left to right. In a further embodiment, not illustrated in the figures, the pins have designation layout source drain gate drain source, from left to right.

The electronic component 95 may, therefore, be mounted on a substrate so that the mounting axis 36 is perpendicular to the surface 37 of the substrate and the length of the pins is perpendicular to the surface 37 of the substrate. The electronic component 95 may be mounted in a first orientation, as illustrated in FIG. 11, and in a second reorientation of the entire electronic component 95 about the mounting axis 36 of 180°. Each designation of pin is translated to the position of the pin having the same designation. The gate pin is translated to a gate pin, the drain pin is translated to a drain pin and the source pin is translated to itself. Consequently, a deterioration in the performance during operation of the electronic component 95 due to the reorientation of the electronic component 95 from the first orientation to the second reorientation is prevented.

Figure 12:
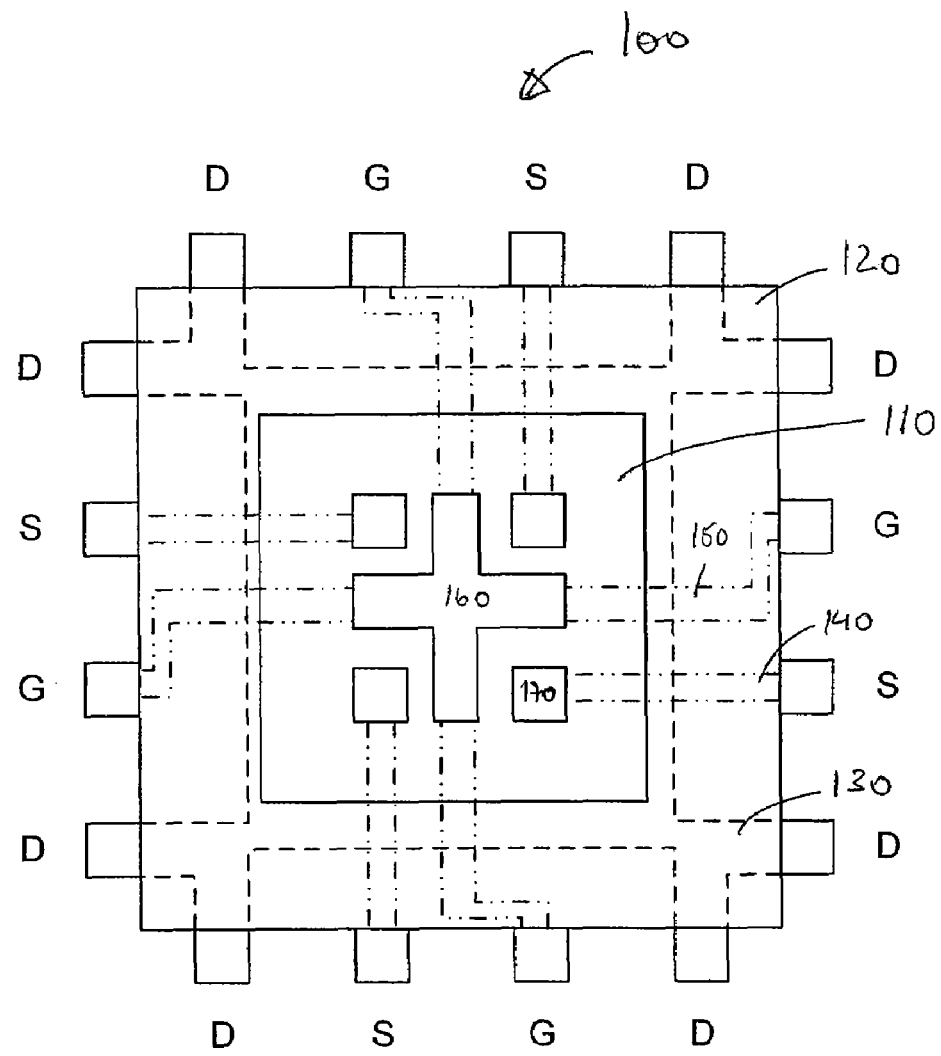
FIG. 12 illustrates a top view of an electronic component according to an eight embodiment.

FIG. 12 shows yet another embodiment which allows for mounting with additional angles different from 180°. The package 120 comprises, for example, a vertical power semiconductor chip 110. External contact pins are designated with letters D, G, S for connection to internal drain, gate, and source terminals. This packaging 120 represents a so-called quad flat packaging and comprises four sides each providing four pins. The internal chip can be placed in any direction within the housing. No specific orientation is necessary. Also, the semiconductor package can be placed on a printed circuit board regardless its orientation. As can be readily seen, the pin assignment remains the same regardless whether, the chip is turned, 90°, 180°, or 270°. The internal power semiconductor chip 110 comprises, for example, a backside layer for coupling the drain with a bottom internal wiring structure 130. Furthermore, the semiconductor chip 110 comprises a central connecting pad 160 arranged on the top of the semiconductor chip 110 for coupling the gate with respective a first top internal wiring structure 150. In this embodiment, four connecting pads 170 are arranged on top of the semiconductor chip 110 as shown to couple the source with a respective second top wiring structure 150. The wiring structure can, thus, be formed by a leadframe with two layers to contact the respective top and bottom contact pads of the semiconductor chip 110. Alternatively, only a bottom leadframe is used and the coupling of the top contact pads 160, 170 is performed similar as described above. As can be seen, the symmetrical design allows for a semiconductor chip 110 to be placed within the housing with any possible orientation. As will be appreciated, other shapes for the chips and or the housing can be used with this concept. Thus, the housing does not necessarily need to have a square shape. Hexagonal, octagonal, or any other similar shape can be used for a semiconductor chip and its housing. Thus, a wide variety of different angles for placing the semiconductor chip can apply as stated above and the placement angle can be different from the mentioned 90°, 180°, 270° orientation angle.

REFERENCE NUMERALS 1 first electronic component
2 MOSFET device
3 leadframe
4 portion of leadframe
5 contact clip
6 plastic encapsulation
7 lower surface
8 outer contact surfaces
9 first surface of MOSFET
10 geometric centre
11 gate electrode
12 first source electrode
13 second source electrode
14 second side of MOSFET
15 drain electrode
16 component axis
17 gate portion
18 source portion
19 source portion
20 drain portion
21 drain portion
22 upper surface of leadframe
23 flat web portion
24 peripheral rim portion
25 lower surface of the flat web portion
26 upper surface of flat web portion
30 PCB
31 gate landing pad
32 source landing pad
33 source landing pad
34 drain landing pad 35 drain landing pad
36 mounting axis
37 substrate surface
40 second electronic component
41 drain portion
42 gate portion
43 gate portion
44 source portion
45 source portion
46 first gate electrode
47 second gate electrode
48 source electrode
49 bond wire
50 second PCB
51 source landing pad
52 gate landing pad
53 drain landing pad
54 gate landing pad
55 source landing pad
60 third electronic component
61 structured metallization
70 fourth electronic component
80 fifth electronic component
90 sixth electronic component
91 first side
92 second side
93 pin
94 chip carrier
95 seventh electronic component
100 device
110 semiconductor chip
120 housing
130 lower internal wiring
140 first upper internal wiring
150 second upper internal wiring
160 gate contact pad
170 source contact pad

What is claimed is:

1. An electronic component comprising:
a semiconductor power device comprising at least one first load electrode, at least one control electrode and at least one second load electrode;
surface mountable outer contact surfaces, wherein the outer contact surfaces are positioned in a contact plane, the contact plane having a component axis of rotation positioned generally perpendicular to the contact plane, and
an electrically conductive rewiring structure, the rewiring structure electrically connecting the first load electrode, the control electrode and the second load electrode to the outer contact surfaces,
wherein the outer contact surfaces have an arrangement defining a component pad layout so that the electronic component is mountable on landing pads of a substrate, the landing pads having a defined landing pad layout, in a first orientation about said axis providing a component performance during operation and is mountable in a selected rotational reorientation about said axis, the selected rotational orientation being an angle other than 360°, on said landing pads having said defined landing pad layout without an alteration in said component performance during operation due to said rotational reorientation.

2. An electronic component according to claim 1, wherein a rotational reorientation of the entire electronic component can be selected from the group of angles consisting of 90°, 180°, and 270°.

3. An electronic component adapted to be mounted on a substrate, the substrate comprising landing pads having a landing pad layout, the electronic component comprising:
a semiconductor power device comprising at least one first load electrode, at least one control electrode and at least one second load electrode,
a plurality of outer contact surfaces having a geometric centre and being positioned in a contact plane, wherein each outer contact surface is assigned one of three different designations and wherein the plurality of outer contact surfaces define a component pad layout;
an electrically conductive rewiring structure, the rewiring structure electrically connecting the first load electrode, the control electrode and the second load electrode to the outer contact surfaces, and
a component axis positioned generally perpendicular to the contact plane and in the geometric centre of said plurality of outer contact surfaces,
wherein the plurality of outer contact surfaces comprise an arrangement so that, in a first orientation, the component pad layout matches the landing pad layout and in a rotational reorientation of the entire electronic component about the component axis by an angle other than 360°, the outer contact surfaces are translated to each other so that the component pad layout matches the landing pad layout.

4. An electronic component according to claim 1, wherein a rotational reorientation of the entire electronic component can be selected from the group of angles consisting of 90°, 180°, and 270°.

5. An electronic component according to claim 1, wherein an angle of rotational reorientation of the entire electronic component about the component axis is approximately 90°, 180°, or only approximately 270°.

6. An electronic component according to claim 1, wherein the semiconductor power device is a vertical semiconductor power device or a lateral semiconductor power device.

7. An electronic component according to claim 1, wherein the semiconductor power device is selected from the group consisting of: a MOSFET, a BJT, and an IGBT.

8. An electronic component according to claim 1, wherein the electronic component is a surface mountable component.

9. An electronic component according to claim 8, further comprising a leadframe having a lower surface, wherein the lower surface of the leadframe provides the outer contact surfaces.

10. An electronic component according to claim 8, wherein the plurality of outer contact surfaces are provided by a plurality of bump contacts.

11. An electronic component according to claim 8 further comprising a contact clip having at least one peripheral rim portion, wherein the outer contact surfaces are provided by outer surfaces of a first structured metallization positioned on a first surface of the semiconductor power device and by lower surfaces of the peripheral rim portion of the contact clip.

12. An electronic component according to claim 8, wherein the semiconductor power device comprises at least one electrically conductive via.

13. An electronic component according to claim 1, wherein the outer contact surfaces are provided by a plurality of pins.

14. An electronic component according to claim 1, wherein the designations of the outer contact surfaces have a designation layout, the designation layout having one of two-fold, three-fold, four-fold and a multiple thereof rotational symmetry about the component axis.

15. An electronic component adapted to be mounted on a substrate having a substrate surface, the substrate comprising landing pads having a landing pad layout, the electronic component comprising:
- a housing having a geometric centre,
- a semiconductor power device comprising at least one first load electrode, at least one control electrode and at least one second load electrode,
- a plurality of outer contacts positioned in a contact plane, wherein each outer contact is assigned one of three different designations and wherein the plurality of outer contacts define a component pad layout;
- an electrically conductive rewiring structure, the rewiring structure electrically connecting the first load electrode, the control electrode and the second load electrode to the outer contacts, and
- a mounting axis positioned in the geometric centre of the housing,
- wherein the plurality of outer contacts have an arrangement so that, in a first orientation about the mounting axis, the mounting axis being positioned generally perpendicular to the substrate surface, the component pad layout matches the landing pad layout and in a rotational reorientation of the entire electronic component about the component axis by an angle other than 360°, the mounting axis being positioned generally perpendicular to the substrate surface, the outer contacts are translated to each other so that the component pad layout matches the landing pad layout.

16. An electronic component according to claim 15, wherein
the mounting axis is positioned generally parallel to said contact plane.

17. An electronic component according to claim 16, wherein
the housing is a TO220-5 package.

18. An electronic component according to claim 16, wherein
the outer contacts are provided by a plurality of pins.

19. An electronic component according to claim 15, wherein
the mounting axis is positioned generally perpendicular to said contact plane.

20. An electronic component according to claim 19, wherein
the outer contacts are provided by a plurality of surface mountable contacts.

21. An electronic component according to claim 15, wherein
a rotational reorientation of the entire electronic component about the mounting axis can be selected from the group of angles consisting of 90°, 180° and 270°.

22. An electronic component according to claim 15, wherein
an angle of rotational reorientation of the entire electronic component about the mounting axis is only approximately 90° or only approximately 180° or only approximately 270°.

23. An electronic component according to claim 15, wherein
each of the three designations translates only within itself.

24. An electronic component according to claim 15, wherein
the semiconductor power device is one of a vertical semiconductor power device and a lateral semiconductor power device.

25. An electronic component according to claim 15, wherein
the semiconductor power device one of the group consisting of a MOSFET, wherein the first load electrode is a source and the second load electrode is a drain, a BJT, wherein the first load electrode is a collector and the second load electrode is an emitter, and an IGBT, wherein the first load electrode is an emitter and the second load electrode is an emitter.

* * * * *

UNITED STATES PATENT AND TRADEMARK OFFICE
CERTIFICATE OF CORRECTION

PATENT NO. : 7,476,978 B2  
APPLICATION NO. : 11/383915  
DATED : January 13, 2009  
INVENTOR(S) : Ralf Otremba Page 1 of 1

It is certified that error appears in the above-identified patent and that said Letters Patent is hereby corrected as shown below:

In Column 16, Claim 4, Line 27:
   Please delete "claim 1" and insert --claim 3--

In Column 16, Claim 5, Line 31:
   Please delete "claim 1" and insert --claim 3--

In Column 16, Claim 6, Line 35:
   Please delete "claim 1" and insert --claim 3--

In Column 16, Claim 7, Line 39:
   Please delete "claim 1" and insert --claim 3--

In Column 16, Claim 8, Line 42:
   Please delete "claim 1" and insert --claim 3--

In Column 16, Claim 13, Line 62:
   Please delete "claim 1" and insert --claim 3--

In Column 16, Claim 14, Line 65:
   Please delete "claim 1" and insert --claim 3--

Signed and Sealed this

First Day of December, 2009

David J. Kappos
*Director of the United States Patent and Trademark Office*